(12) United States Patent
Chuang

(10) Patent No.: US 9,781,851 B2
(45) Date of Patent: Oct. 3, 2017

(54) ELECTRONIC DEVICE WITH AN ELASTIC MEMBER

(71) Applicant: FOXCONN INTERCONNECT TECHNOLOGY LIMITED, Grand Cayman (KY)

(72) Inventor: Shun-Jung Chuang, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/209,708

(22) Filed: Jul. 13, 2016

(65) Prior Publication Data

US 2017/0020017 A1 Jan. 19, 2017

(30) Foreign Application Priority Data

Jul. 13, 2015 (CN) .................................. 104122585

(51) Int. Cl.
*G06F 1/16* (2006.01)
*H04M 1/02* (2006.01)
*H05K 5/02* (2006.01)
*H04M 1/725* (2006.01)

(52) U.S. Cl.
CPC ........ *H05K 5/0204* (2013.01); *H04M 1/0254* (2013.01); *H04M 1/72575* (2013.01)

(58) Field of Classification Search
None
See application file for complete search history.

(56) References Cited

U.S. PATENT DOCUMENTS

| | | | | |
|---|---|---|---|---|
| 5,243,218 A | * | 9/1993 | Zenitani | H01L 23/4006 257/712 |
| 5,303,121 A | * | 4/1994 | Thornberg | H05K 1/141 174/255 |
| 5,333,733 A | * | 8/1994 | Murata | H05K 13/0084 206/714 |
| 5,375,710 A | * | 12/1994 | Hayakawa | H05K 7/1023 206/724 |
| 5,480,840 A | * | 1/1996 | Barnes | H01L 25/18 29/836 |
| 5,690,233 A | * | 11/1997 | Kaneko | H05K 13/0084 206/713 |
| 5,727,688 A | * | 3/1998 | Ishii | H05K 13/003 206/714 |

(Continued)

FOREIGN PATENT DOCUMENTS

| | | |
|---|---|---|
| CN | 202111495 | 1/2012 |
| TW | M438069 | 9/2012 |

(Continued)

*Primary Examiner* — Xanthia C Cunningham
(74) *Attorney, Agent, or Firm* — Wei Te Chung; Ming Chieh Chang

(57) ABSTRACT

An electronic device includes a framework defining a number of receiving grooves and a number of modules detachably retained in the receiving grooves. Each receiving groove has a respective notch at a bottom thereof. Each of the modules includes an insulative housing defining a receiving room, a cover having an opening, and an elastic member received in the receiving room. The elastic member has a tuber extending through the opening to engage the notch and a pair of ear portions welded on an inner surface of the cover.

16 Claims, 6 Drawing Sheets

(56) References Cited

U.S. PATENT DOCUMENTS

| | | | | |
|---|---|---|---|---|
| 5,758,776 | A * | 6/1998 | Slocum | H05K 13/0084 206/714 |
| 5,769,236 | A * | 6/1998 | Maruyama | H05K 13/0417 206/713 |
| 5,848,703 | A * | 12/1998 | Murphy | H01L 21/67336 206/486 |
| 5,878,890 | A * | 3/1999 | Kaneko | H05K 13/0084 206/714 |
| 5,918,189 | A * | 6/1999 | Kivela | H01Q 1/243 343/700 MS |
| 5,988,394 | A * | 11/1999 | Emoto | B65D 21/0204 206/562 |
| 6,003,675 | A * | 12/1999 | Maruyama | H05K 13/0084 206/486 |
| 6,056,124 | A * | 5/2000 | Kaneko | H05K 13/0084 206/561 |
| 6,152,304 | A * | 11/2000 | Hikita | H05K 13/021 206/713 |
| 6,227,372 | B1 * | 5/2001 | Thomas | H01L 21/67336 206/454 |
| 6,678,163 | B1 * | 1/2004 | Neal | H01L 23/051 257/726 |
| 6,829,147 | B2 * | 12/2004 | Streltsov | H01L 23/041 257/685 |
| 6,952,046 | B2 * | 10/2005 | Farrell | H01L 21/50 257/678 |
| 7,212,408 | B2 * | 5/2007 | Noble | G06F 1/18 361/715 |
| 7,306,092 | B1 * | 12/2007 | Heinzl | B65G 47/44 198/803.14 |
| 7,410,363 | B1 * | 8/2008 | Gattuso | H01R 12/87 439/526 |
| 7,413,481 | B2 * | 8/2008 | Redmond, III | H01R 13/514 439/49 |
| 7,690,107 | B2 * | 4/2010 | Heisen | H05K 3/361 29/832 |
| 8,050,715 | B1 | 11/2011 | Cole | |
| 8,676,370 | B2 * | 3/2014 | Lambert | H05K 13/021 198/867.12 |
| 8,964,404 | B2 * | 2/2015 | Poetzinger | G01R 1/0425 206/701 |
| 9,105,674 | B2 * | 8/2015 | Lo | B65D 5/50 |
| 9,287,216 | B2 * | 3/2016 | Haba | H01L 23/481 |
| 2003/0002265 | A1 * | 1/2003 | Simmons | B81B 7/007 361/749 |
| 2010/0265667 | A1 * | 10/2010 | Masucci | H01R 13/665 361/730 |
| 2013/0050945 | A1 * | 2/2013 | Diep | G06F 1/181 361/704 |
| 2013/0135067 | A1 | 5/2013 | Choi | |
| 2014/0085815 | A1 | 3/2014 | Filipovic et al. | |
| 2015/0288422 | A1 | 10/2015 | Fishman et al. | |

FOREIGN PATENT DOCUMENTS

| | | |
|---|---|---|
| TW | 201339856 | 10/2013 |
| TW | M496152 | 2/2015 |

* cited by examiner

ELECTRONIC DEVICE WITH AN ELASTIC MEMBER

BACKGROUND OF THE INVENTION

1. Field of the Invention

The present disclosure relates generally to an electronic device, and more particularly to an electronic device with an elastic member.

2. Description of Related Arts

U.S. Patent Application Publication No. 20150288422 discloses a system for enabling a chassis-coupled modular mobile electronic device. The system includes a modular electronic device enablement system, a set of module couplers, and a chassis. The module couplers preferably couple modules mechanically to the chassis. The module couplers may have detents or structures that resist movement of the modules when they are fully coupled, including spring-loaded balls mounted on a surface of the module that fits into corresponding shallow holes on a complementary surface of the module coupler. The module coupler may also retain the module using a latching mechanism, e.g., a pin that when extended prevents the module from being removed (the pin would be retracted to remove the module), or a snap latch that holds the module tight against the contact surfaces of the module coupler when engaged. The module couplers preferably have mechanical guides or other guides to aid in aligning the module during coupling and in module retention through friction. The guides are preferably defined by a cavity with a geometric profile that is complementary to at least a portion of the profile of a module, e.g., the module couplers are profiled to retain soft-trapezoidally-shaped modules. The module couplers are preferably designed to contact a module of a soft trapezoidal shape on four surfaces, three sides of the module and the bottom of the module. The module coupler may additionally also retain the module with a retention mechanism, e.g., magnets placed on a far edge of the module coupler and a corresponding edge of an inserted module. The modules and the module couplers are preferably sized according to a grid system. The multiple modules may additionally or alternatively couple together with an adapter, e.g., a clip-on rib to allow them to fit securely in the module coupler. In a varied module coupler, electropermanent magnets (EPMs) may also be included.

An improved module retaining mechanism is desired.

SUMMARY OF THE INVENTION

Accordingly, an object of the present invention is to provide an electronic device having a number of detachable modules with a high retention force.

To achieve the above object, an electronic device includes a framework defining a plurality of receiving grooves and a plurality of modules detachably retained in the receiving grooves. Each receiving groove has a respective notch at a bottom thereof. Each of the modules includes an insulative housing defining a receiving room, a cover having an opening, and an elastic member received in the receiving room. The elastic member has a tuber extending through the opening to engage the notch and a pair of ear portions welded on an inner surface of the cover.

Compared with the known technology, the disclosure has the following advantages: the elastic member received in the receiving room protrudes from the opening and latch with the notch at bottom, which could enhance the retention force between the modules and the framework.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Referring to FIGS. 1 to 6, an electronic device 100 includes a framework 1 and a number of modules 2 detachably mounted to the framework 1. The framework 1 defines a longitudinal direction and a transverse direction perpendicular to the longitudinal direction.

Figure 1:
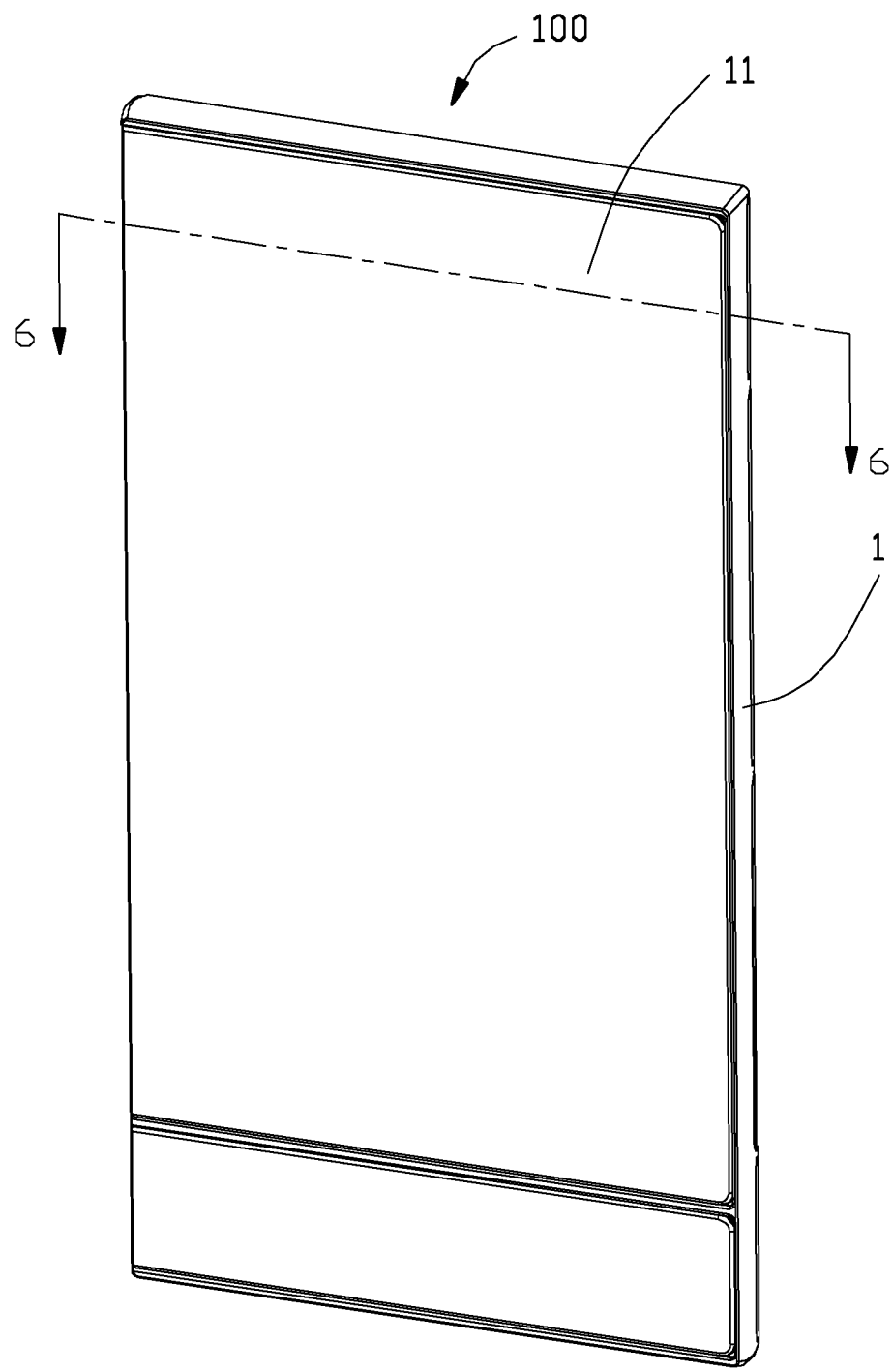
FIG. 1 is a perspective, assembled view of an electronic device of the present invention.
Figure 2:
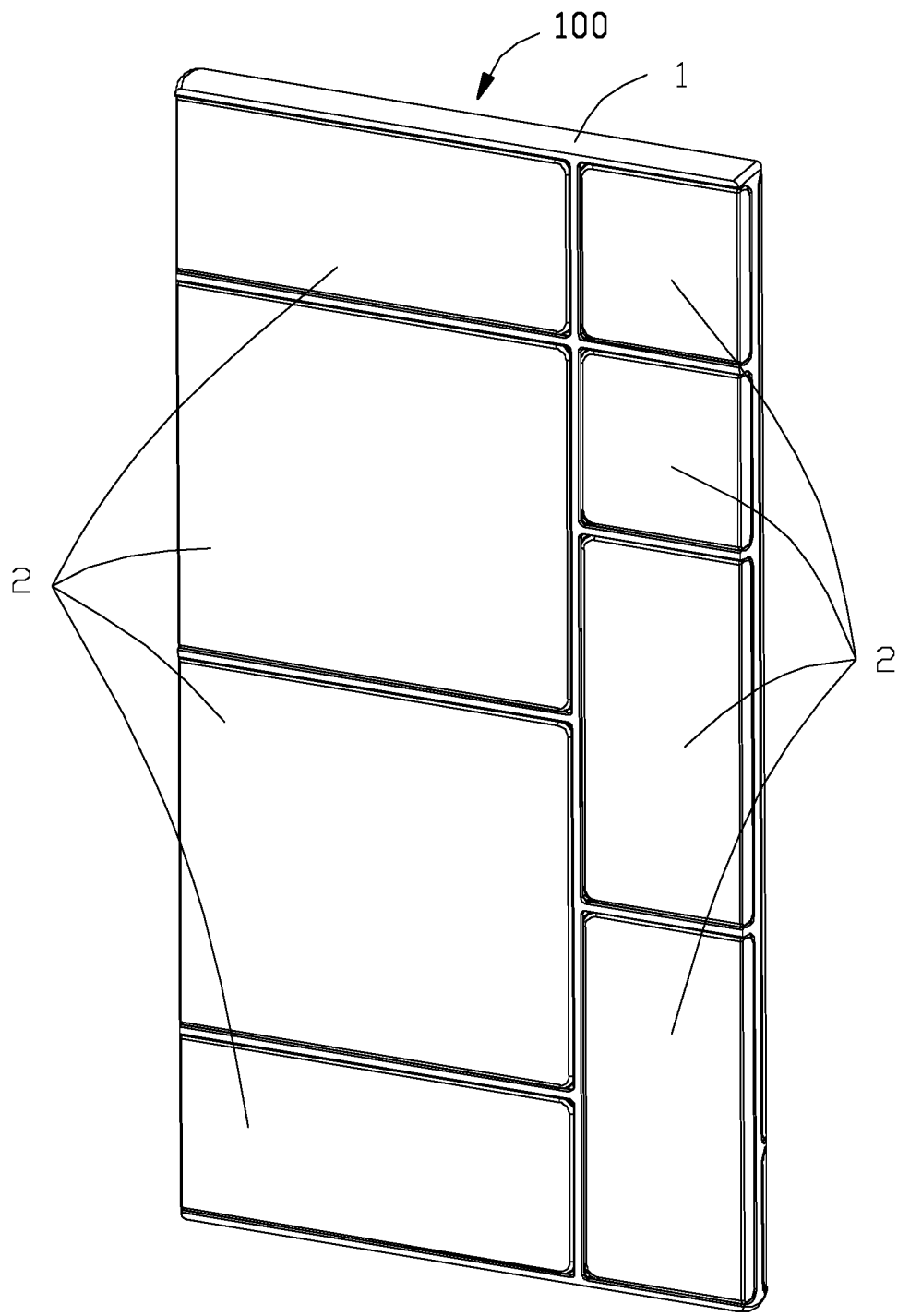
FIG. 2 is another perspective view of FIG. 1.
Figure 3:
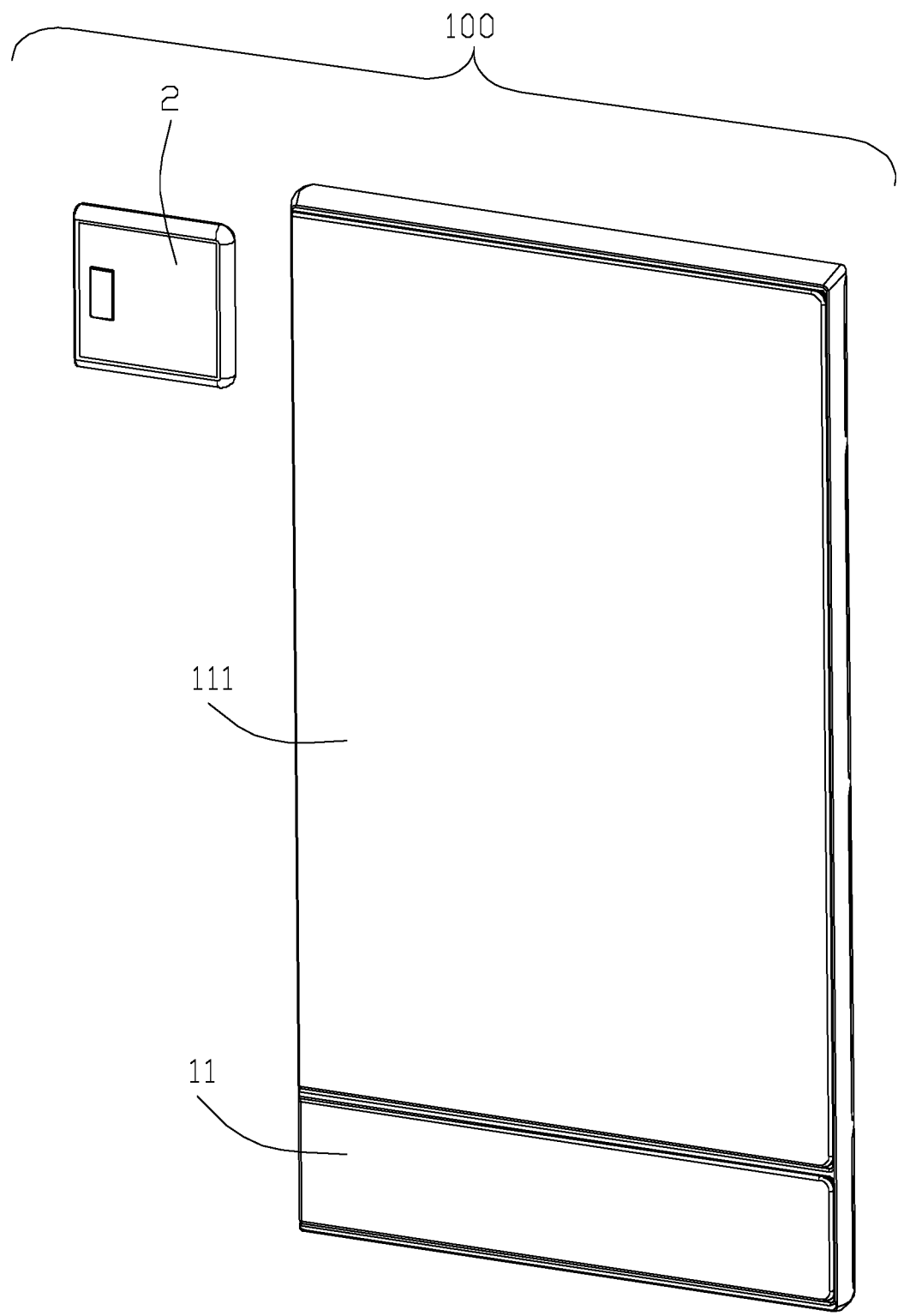
FIG. 3 is an exploded view of the electronic device.
Figure 4:
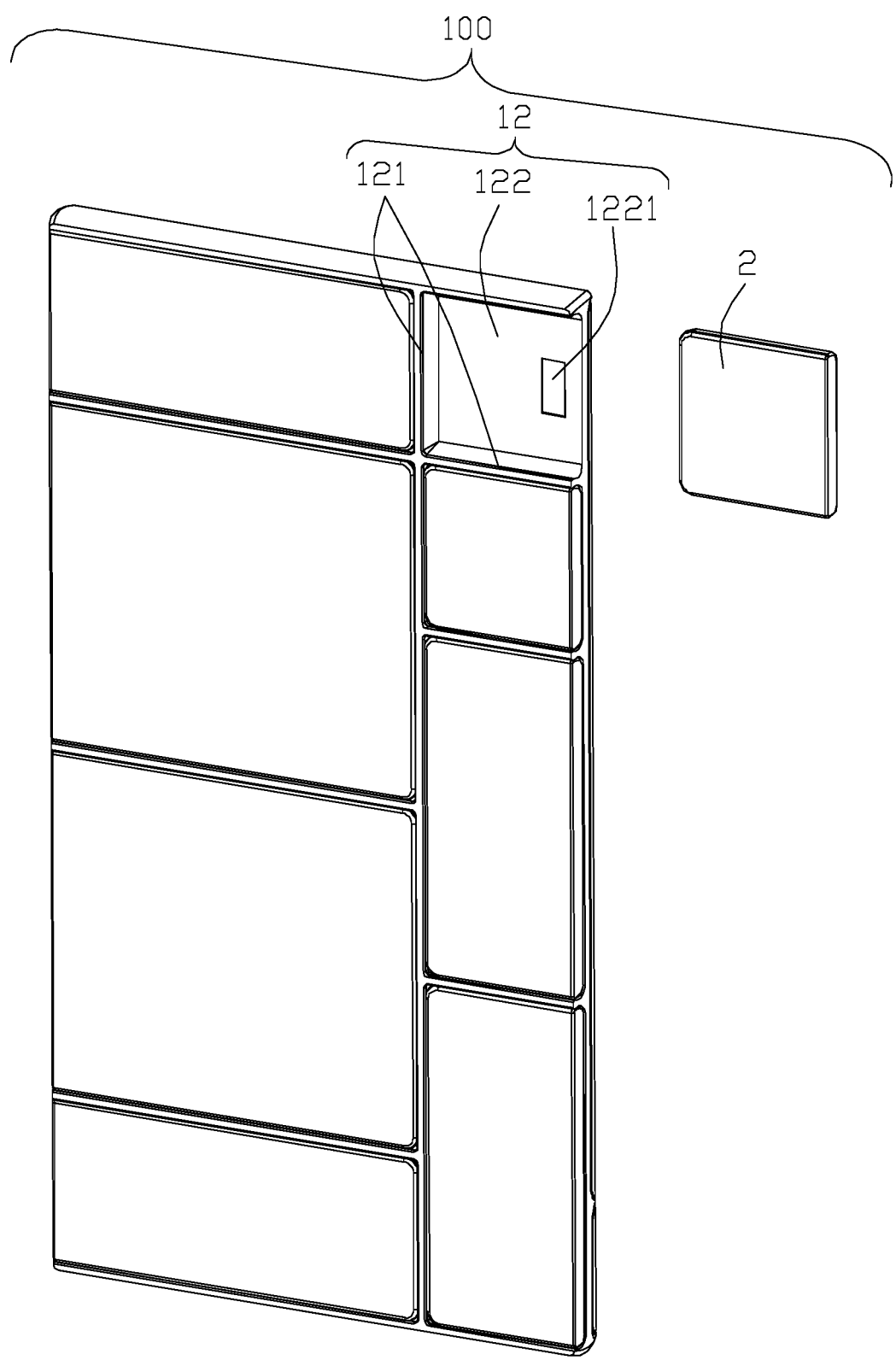
FIG. 4 is another perspective view of FIG. 3.

Referring to FIGS. 3 to 4, the framework 1 includes an upper surface 11 and a lower surface 12 positioned oppositely against the upper surface 11. The upper surface 11 has a panel slot 111 reserved for the screen. The lower surface 12 includes a number of segmented ribs 121. The segmented ribs separate the lower surface 12 into various receiving grooves 122 for receiving different modules 2. Each receiving groove 122 includes a notch 1221 at bottom therein.

Referring to FIGS. 3 to 6, each module 2 includes an insulative housing 21, a cover 22 enclosing the insulative housing 21 for forming a receiving room 20, and an elastic member 23 received in the receiving room 20. The cover 22 has an opening 201. The elastic member 23 protrudes from the cover 22 and includes a number of peripheral portions 231 and a tuber 232 surrounded by the peripheral portions 231. The peripheral portions 231 are attached to an inner surface 221 of the receiving room 20 and the tuber 232 protrudes from the opening 201 to latch with the notch 1221. In the preferred embodiment, the elastic member 23 further includes a pair of ear portions 233 extending outwardly from the peripheral portions 231. The ear portions 233 are welded on the inner surface 221 at two laser spots respectively to provide an elastic retention force. Each ear portion 233 shaping as M shape includes a curved portion 2331 located at a middle position and a straight portion 2332 connected with the peripheral portions 2331. The curved portion 2331 is separated from the peripheral portions 231. And each laser spot is located at the curved portion 2331.

Figure 5:
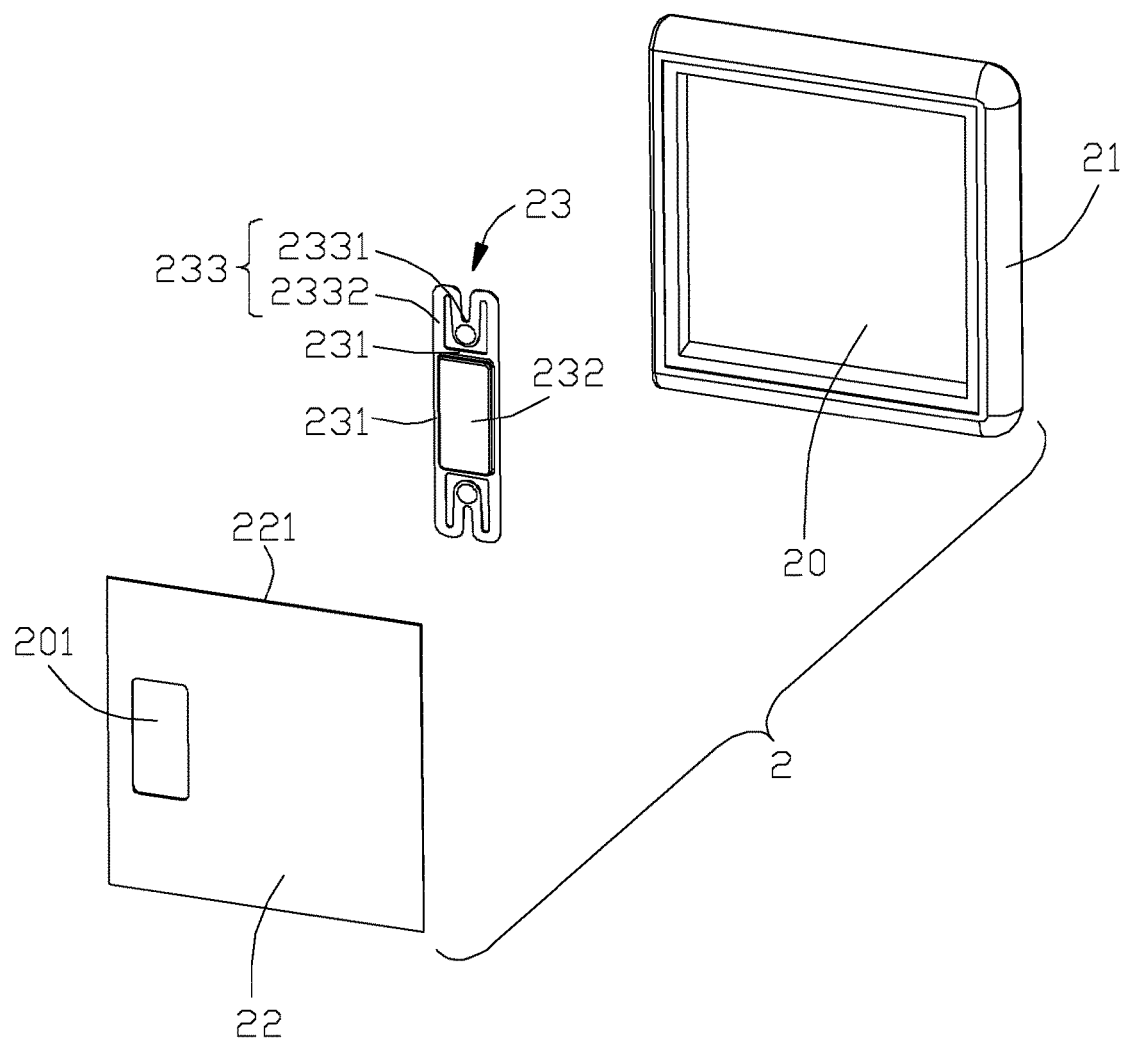
FIG. 5 is an exploded view of the modules of the electronic device.
Figure 6:
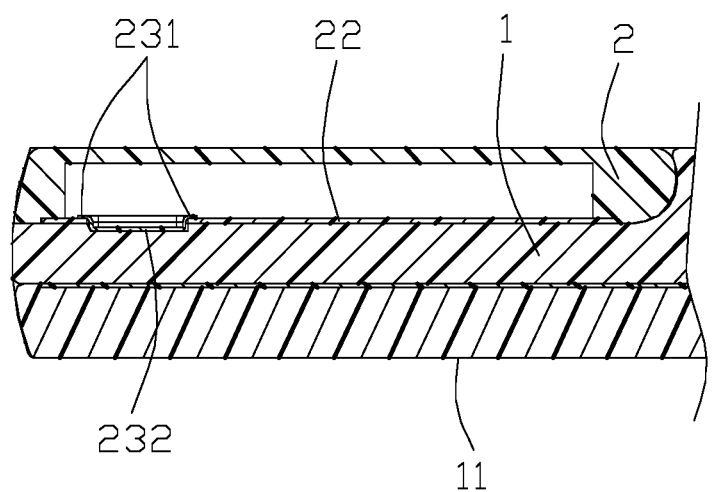
FIG. 6 is a cross-sectional view of the electronic device taken along line 6-6 in FIG. 1.

Referring to FIGS. 5 and 6, the modules 2 are assembled to the framework 1 along the transverse direction, and the modules 2 are detached from the framework 1 along the transverse direction. Each module 2 is slid into to the corresponding receiving groove 122 along the transverse direction. The tuber 232 and the ear portions 233 are located inside and outside of the cover 22. In the preferred embodiment, the cover 22 is made of metal. The electronic device 100 may further include an EPM (Electro Permanent Magnet) in the framework 1. The framework 1 and the module 2 preferably have complementary interface pads. The framework 1 preferably has an electro permanent magnet while the module 2 has a complementary magnetic attachment point. When the module 2 is slid into the framework 1, the mechanical rails enable the module 2 to be guided into an attachment position, whereby the modules are detachably retained in the receiving grooves and the interface pads of the module 2 and the framework 1 interact. Then, the electro permanent magnet is activated to secure the module 2 in that position. Additionally or alternatively, the module 2 may have an electro permanent magnet while the framework 1 has a complementary magnetic attachment point.

When the electronic device demands to update, individual module 2 is able to be replaced with corresponding function. When the modules 2 are detached from the framework 1, the retention force between the framework 1 and the modules 2 needs to be overcome.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An electronic device comprising:
   a framework defining a plurality of receiving grooves each having a respective notch at a bottom thereof; and
   a plurality of modules detachably retained in the receiving grooves, each of the modules comprising:
      an insulative housing defining a receiving room;
      a cover having an opening; and
      an elastic member received in the receiving room, the elastic member having a tuber extending through the opening to engage the notch and a pair of ear portions welded on an inner surface of the cover.

2. The electronic device as claimed in claim 1, wherein the elastic member includes a plurality of peripheral portions surrounding the tuber, the peripheral portions are attached to the inner surface of the cover, and the ear portions extend outwardly from the peripheral portions.

3. The electronic device as claimed in claim 1, wherein each ear portion includes a middle curved portion separated from the peripheral portions and a straight portion connected with the peripheral portions, and the welded portions are located at the curved portions.

4. The electronic device as claimed in claim 1, wherein the cover is made of metal.

5. An electronic device comprising:
   a framework defining a plurality of receiving grooves each having a respective notch at a bottom thereof; and
   a plurality of modules detachably and snugly retained in the receiving grooves, each of the modules comprising:
      an insulative housing defining a receiving room;
      a cover attached to the housing and shielding the receiving room; and
      an elastic member having a tuber extending beyond the cover away from the housing and through the opening to engage the notch; wherein
      said tuber is elastically deformable radially in the notch so as to result in an enhanced retention between the tuber and a periphery of the notch, thus assuring retention between the module and the frame work disregarding whether magnetic attraction exists between the module and the frame work.

6. The electronic device as claimed in claim 5, wherein the elastic member further includes ear portions welded to an inner surface of the cover.

7. The electronic device as claimed in claim 6, wherein the elastic member includes a plurality of peripheral portions surrounding the tuber, the peripheral portions are attached to the inner surface of the cover, and the ear portions extend outwardly from the peripheral portions.

8. The electronic device as claimed in claim 7, wherein the ear portions includes a middle curved portion separated from the peripheral portions and a straight portion connected with the peripheral portions, and the welded portions are located at the curved portions.

9. The electronic device as claimed in claim 5, wherein the cover is made of metal.

10. The electronic device as claimed in claim 5, wherein said magnetic attraction exists between the module and the framework.

11. A method of assembling electronic device comprising steps of:
    providing a framework with therein a plurality of grooves each equipped with a notch in a bottom face; and
    loading a plurality of modules into the corresponding grooves, respectively; wherein
    each of said module includes an insulative housing with a receiving room therein, and a cover attached to the housing and covering said receiving room; wherein
    each of said module is further equipped with an elastic member having a tuber extending beyond the cover away from the housing and into the corresponding notch; wherein
    the tuber is elastically deformable within the notch for providing radial retention therebetween disregarding whether a magnetic attraction exists between the framework and the module.

12. The method as claimed in claim 11, wherein the elastic member further includes ear portions welded to an inner surface of the cover.

13. The method as claimed in claim 12, wherein the elastic member includes a plurality of peripheral portions surrounding the tuber, the peripheral portions are attached to the inner surface of the cover, and the ear portions extend outwardly from the peripheral portions.

14. The method as claimed in claim 13, wherein the ear portions includes a middle curved portion separated from the peripheral portions and a straight portion connected with the peripheral portions, and the welded portions are located at the curved portions.

15. The method as claimed in claim 11, wherein the cover is made of metal.

16. The method as claimed in claim 11, wherein the magnetic attraction exists between the module and the framework.

* * * * *